United States Patent
Lu

(10) Patent No.: US 7,242,220 B2
(45) Date of Patent: Jul. 10, 2007

(54) SIGNAL TRANSMITTING SYSTEM AND METHOD AND SIGNAL DRIVING DEVICE THEREOF

(75) Inventor: Shi-Hsiang Lu, Taipei (TW)

(73) Assignee: AU Optronics Corp., Hsin-Chu (TW)

( * ) Notice: Subject to any disclaimer, the term of this patent is extended or adjusted under 35 U.S.C. 154(b) by 76 days.

(21) Appl. No.: 11/062,874

(22) Filed: Feb. 23, 2005

(65) Prior Publication Data

US 2006/0055425 A1 Mar. 16, 2006

(30) Foreign Application Priority Data

Sep. 15, 2004  (TW) .............................. 93127940 A

(51) Int. Cl.
*H03K 19/175* (2006.01)
(52) U.S. Cl. .............................. 326/68; 326/81; 326/83
(58) Field of Classification Search .................. 326/63, 326/68, 81–87
See application file for complete search history.

(56) References Cited

U.S. PATENT DOCUMENTS 5,095,230 A * 3/1992 Takai et al. .................... 326/60
5,896,044 A * 4/1999 Walden ........................ 326/80
6,133,757 A * 10/2000 Huang et al. .................. 326/87

* cited by examiner

*Primary Examiner*—Don Le
(74) *Attorney, Agent, or Firm*—Rabin & Berdo, P.C.

(57) ABSTRACT

A signal transmitting system comprising a signal outputting unit and a signal receiving unit is provided. The signal outputting unit receives a first signal and outputs a second signal. The signal receiving unit receives the second signal and outputs a third signal. The signal outputting unit comprises an inverting device which receives the first signal and outputs a first inverted signal, and a signal driving device which receives the first inverted signal and outputs the second signal. The signal driving device comprises two NMOS transistors. The first NMOS transistor has a drain biased by a first voltage, and a gate receiving a control signal. The second NMOS transistor has a gate receiving the first inverted signal, a source biased by a second voltage, and a drain electronically coupled to the source of the first transistor. The drain of the second NMOS transistor outputs the second signal.

30 Claims, 6 Drawing Sheets

SIGNAL TRANSMITTING SYSTEM AND METHOD AND SIGNAL DRIVING DEVICE THEREOF

This application claims the benefit of Taiwan application Serial No. 93127940, filed Sep. 15, 2004, the subject matter of which is incorporated herein by reference.

BACKGROUND OF THE INVENTION

1. Field of the Invention

The invention relates in general to a signal transmitting system, and more particularly, to a signal transmitting system and method and the signal driving device thereof.

2. Description of the Related Art

A large amount of power loss will occur when signals are transmitted via a long transmission line. Since the power consumption is proportional to the square of the voltage during signal transmission, a signal transmitting system is normally used to reduce the voltage of signal at the outputting end first, use a lower voltage level to transmit the signal so as to reduce power loss, and the voltage of the signal is risen to original level at the receiving end.

Referring to FIG. 1, a configuration diagram of a conventional signal transmitting system is shown. The signal transmitting system 100 comprises a conventional signal outputting unit 110 and a signal receiving unit 120. The conventional signal outputting unit 110 receives a first signal S1 then outputs a second signal S2, wherein the second signal S2 has a level lower than the first signal S1 and is substantially of the same phase with the first signal S1. After that, the signal receiving unit 120 receives the second signal S2 and outputs a third signal S3, wherein the third signal S3 is substantially the same with the first signal S1. The voltage of the signal is reduced during transmission and is restored to the original voltage level after the signal at the receiving end.

Referring to FIG. 2, a circuit diagram of a conventional signal transmitting system is shown. Conventional signal outputting unit 110 comprises an inverting device 112 and an inverting device 114. The inverting device 112 is a CMOS inverter according to prior art for receiving a first signal S1 and outputs a first inverted signal S1', wherein the first inverted signal S1' and the first signal S1 are of opposite phases. The inverting device 112 comprises an NMOS transistor T1 and a PMOS transistor T2, wherein the source of the PMOS transistor T2 is biased by the main voltage Vh.

The inverting device 114 is a CMOS inverter according to prior art for receiving the first inverted signal S1' and outputting a second signal S2. The inverting device 114 comprises an NMOS transistor T3 and a PMOS transistor T4, wherein the source of the PMOS transistor T4 is biased by a main voltage Vl, the main voltage Vl is lower than the first the main voltage Vh. Since the main voltage Vl is lower than the main voltage Vh, the second signal S2 and the first signal S1 can have the same phase, while the level of the second signal S2 is lower than that of the first signal S1.

Despite that the above signal transmitting system avoids power loss during transmission, the corresponding time of equivalent resistor and equivalent capacitance of the transmission line 130 still affects the signal transmission speed due to the length of the transmission line 130. Under such circumstances, a MOS transistor with larger power current driving ability is required to promptly increase the transmission line 130 to a target level.

In conventional CMOS inverter 114, since the electron mobility $\mu p$ of the PMOS is approximately equal to ⅓ of the electron mobility $\mu n$ of the NMOS, the PMOS transistor will have a lower operating speed and a poorer power current driving ability. For the PMOS transistor to generate a larger power current so as to increase the power current driving ability, the transistor aspect ratio (W/L) must be increased. Consequently, the size of the conventional signal outputting unit 110 becomes larger. How to reduce the size of the signal outputting unit has thus become an imminent challenge to the semiconductor industry.

SUMMARY OF THE INVENTION

It is therefore an object of the invention to provide a signal transmitting system and a signal driving device capable of reducing the voltage of the signal during transmission and restoring the voltage to the original level at the receiving end. The invention has the advantages of saving the size, improving driving ability and increasing transmission speed.

The invention achieves the above-identified object by providing a signal transmitting system mainly comprising a signal outputting unit and a signal receiving unit. The signal outputting unit comprises an inverting device and a signal driving device. The inverting device is used for receiving a first signal and outputting a first inverted signal. The signal driving device is used for receiving the first inverted signal and outputs a second signal. The signal driving device comprises a first NMOS transistor and a second NMOS transistor. The drain of the first NMOS transistor is biased by a first voltage. The gate of the first NMOS transistor receives a control signal. The control signal and the first signal are substantially of the same phase. The gate of the second NMOS transistor receives the first inverted signal. The source of the second NMOS transistor is biased by a second voltage, which is lower than the first voltage. The drain of the second NMOS transistor is electronically coupled to the source of the first NMOS transistor and outputs the second signal. The second signal and the first signal are substantially of the same phase. A high level of the first signal is higher than a high level of the second signal. The signal receiving unit is used for receiving the second signal and outputting a third signal accordingly. A high level of the third signal is substantially the same with the high level of the first signal.

According to another object of the invention, a signal transmitting method for applying to a signal driving device is provided. The signal driving device is electrically connected with an inverting device. The inverting device receives a first signal and outputs a first inverted signal. The signal driving device comprises a first NMOS transistor and a second NMOS transistor. The gate of the second NMOS transistor receives the first inverted signal. The source of the first NMOS transistor and the drain of the second NMOS transistor are electronically coupled for outputting a second signal. The drain of the first NMOS transistor is biased by a first voltage. The gate of the first NMOS transistor receives a control signal. The control signal and the first signal are substantially of the same phase. The source of the second NMOS transistor is biased by a second voltage which is lower than the first voltage. The method comprises the following steps. Firstly, it is performed to provide the control signal having a low level to the first NMOS when the first signal is at a low level, so that the second NMOS transistor is conducted and the first NMOS transistor is cut-off. After that, it is performed to provide the control signal having a high level to the first NMOS when the first signal is at a high level, wherein the high level of the control signal is higher than the sum of a high level of the second signal and the threshold voltage of the first NMOS transistor, so that the second NMOS transistor is cut-off, the first NMOS transistor is conducted, and the first NMOS transistor outputs the second signal having substantially the same phase with the first signal. The high level of the first signal is higher than the high level of the second signal.

Other objects, features, and advantages of the invention will become apparent from the following detailed description of the preferred but non-limiting embodiments. The following description is made with reference to the accompanying drawings.

DETAILED DESCRIPTION OF THE INVENTION

EMBODIMENT ONE

Figure 1:
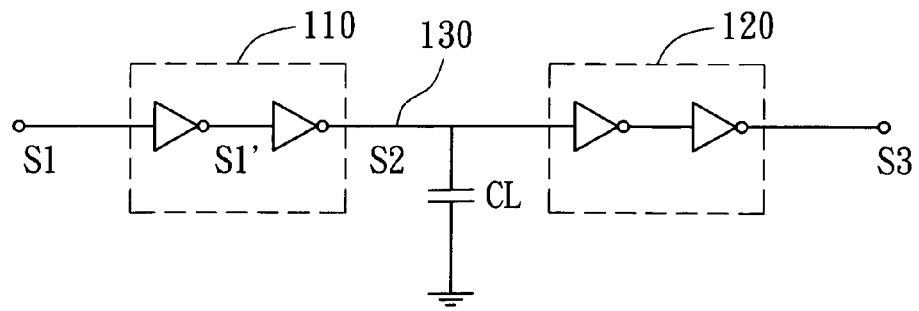
FIG. 1 is a configuration diagram of a conventional signal transmitting system.
Figure 2:
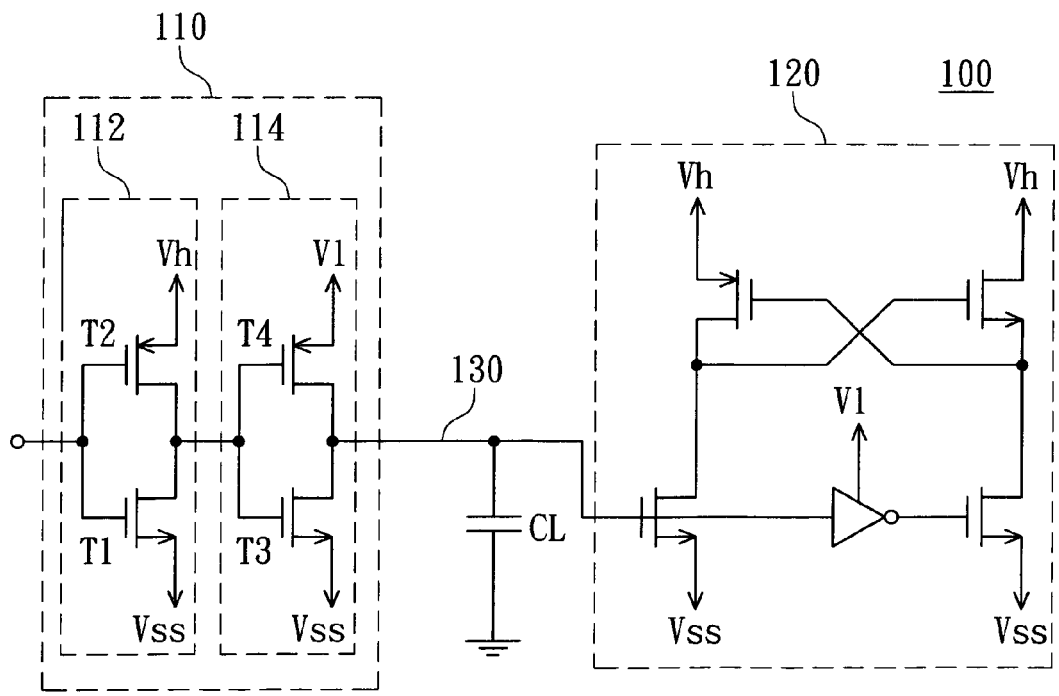
FIG. 2 is a circuit diagram of a conventional signal transmitting system.
Figure 3:
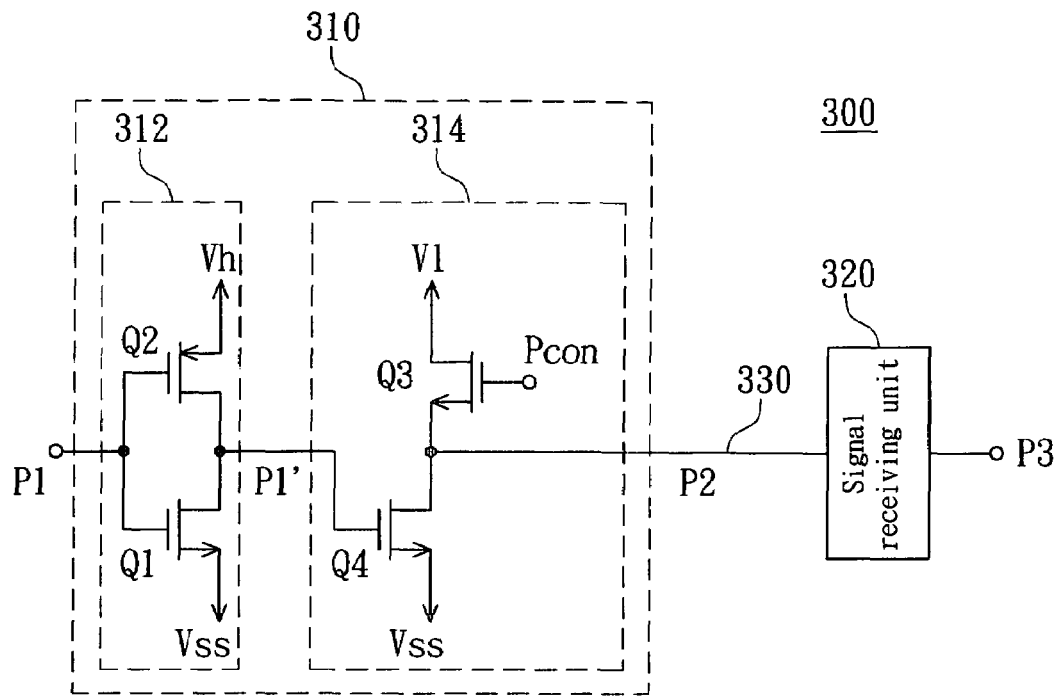
FIG. 3 is a configuration diagram of the signal transmitting system according to first embodiment of the invention.

Referring to FIG. 3, a configuration diagram of the signal transmitting system according to first embodiment of the invention is shown. Signal transmitting system 300 comprises a signal outputting unit 310 and a signal receiving unit 320. The signal outputting unit 310 receives a first signal P1 and outputs a second signal P2 having the same phase with the first signal P1 to the signal receiving unit 320, while the first high level of the first signal P1 (e.g., 7V) is higher than the second high level of the second signal P2 (e.g., 3V). After that, the signal receiving unit 320 receives the second signal P2 and outputs a third signal P3. The first high level of the first signal P1 is substantially the same with the third high level of the third signal P3.

The signal outputting unit 310 comprises an inverting device 312 and a signal driving device 314. The inverting device 312 receives the first signal P1 and outputs a first inverted signal P1' whose phase is opposite to that of the first signal P1 to the signal driving device 314. The signal driving device 314 outputs the second signal P2 according to the first inverted signal P1'. The inverting device 312, a CMOS inverter for instance, comprises an NMOS transistor Q1 and a PMOS transistor Q2, while the source of the NMOS transistor Q1 is biased by a low voltage Vss, the source of the PMOS transistor Q2 is biased by the main voltage Vh (e.g., 7V). The low voltage Vss can be a ground voltage for instance.

The signal driving device 314 comprises an NMOS transistor Q3 and an NMOS transistor Q4. The drain of the NMOS transistor Q3 is biased by the main voltage Vl (e.g., 3V), the gate of the NMOS transistor Q3 receives a control signal Pcon having the same phase with the first signal P1, and the drain of the NMOS transistor Q4 is electronically coupled to the source of the NMOS transistor Q3 and outputs the second signal P2. The gate of the NMOS transistor Q4 receives the first inverted signal P1', while the source of the NMOS transistor 04 is biased by the low voltage Vss. The main voltage Vh, the main voltage Vl and the low voltage Vss have the following relationship: the main voltage Vh is higher than the main voltage Vl; the main voltage Vl is higher than the low voltage Vss. In order to achieve a normal operation, the signal driving device 314 must satisfy the following conditions: when the control signal Pcon is at a control signal high level, the control signal high level must be higher than sum of the second high level and the threshold voltages Vtn of the NMOS transistor Q3, meanwhile, the NMOS transistor Q3 is conducted, but the NMOS transistor Q4 is not conducted.

The principles of the above conditions are elaborated below. When the control signal Pcon is at the control signal high level, the voltage of the transmission line 330 can reach the second high level at maximum, meanwhile, the second high level is substantially equal to or close to the main voltage Vl. Meanwhile, the required conditions for the NMOS transistor Q3 to be fully conducted are as follows:

$Vgs(Q3)$ (the voltage difference between the gate and the source of the NMOS transistor $Q3$)$>Vtn;$ $Vgs(Q3)$=the high level of the control signal $Pcon-$ the second high level $>Vtn;$ and The high level of the control signal>the second high level+$Vtn$.

In addition to the object of reducing power loss of signals, the signal transmitting system and the signal driving device of the invention disclosed in above preferred embodiment has the advantages of having a faster signal transmission speed, a smaller size, and a better power current driving ability, and complies with the features of lightness and miniaturization required in today's high-speed signal transmission and electronic devices.

EMBODIMENT TWO

Figure 4:
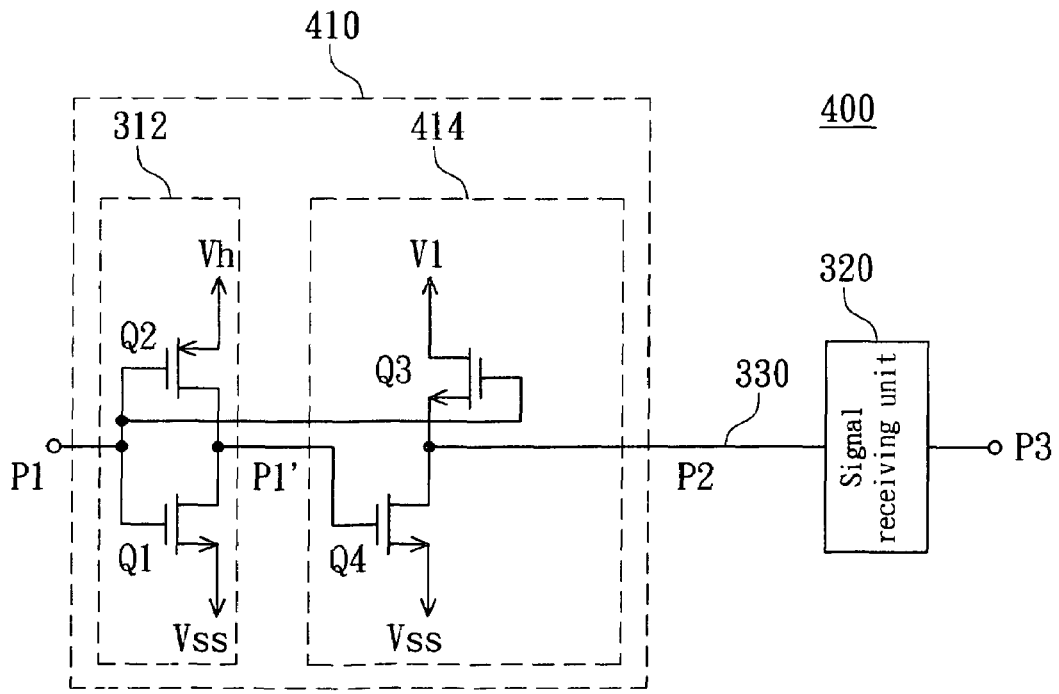
FIG. 4 is a configuration diagram of the signal transmitting system according to second embodiment of the invention.

Referring to FIG. 4, a configuration diagram of the signal transmitting system according to second embodiment of the invention is shown. What the present preferred embodiment differs with first embodiment is: the gate of the NMOS transistor Q3 receives the control signal Pcon in the signal driving device 314, while the gate of the NMOS transistor Q3 receives the first signal P1 in the signal driving device 414 with other conditions remaining unchanged. In the first embodiment, the conditions required of the control signal Pcon are as follows:

1. The control signal Pcon must be higher than the sum of the second high level and the Vtn value when at high level; and
2. The control signal Pcon must be substantially of the same phase with the first signal P1. The control signal Pcon can be adapted to receive the first signal P1 if the first high level of the first signal P1 is higher than the sum of the second high level and the Vtn value of the NMOS transistor Q3.

It is understood in first embodiment, when the control signal Pcon is at the control signal high level, the transmission line 330 can be charged to the main voltage VI, and the required conditions for the NMOS transistor Q3 to be fully conducted are as follows:

The control signal high level>the second high level+ Vtn.

In the present preferred embodiment, the control signal Pcon is exemplified by the first signal P1, so the above expression is:

The first high level>the second high level+Vtn.

Since the first high level is substantially equal to the main voltage Vh, the following expression is obtained:

The main voltage Vh>the second high level+Vtn.

Since the second high level is substantially equal to the main voltage VI, the following expression is obtained:

The main voltage Vh>the main voltage VI+Vtn. When the gate of the NMOS transistor is adapted to receive the first signal P1, the obtained condition is: the main voltage Vh must be higher than the sum of the main voltage VI and Vtn.

EMBODIMENT THREE

Figure 5:
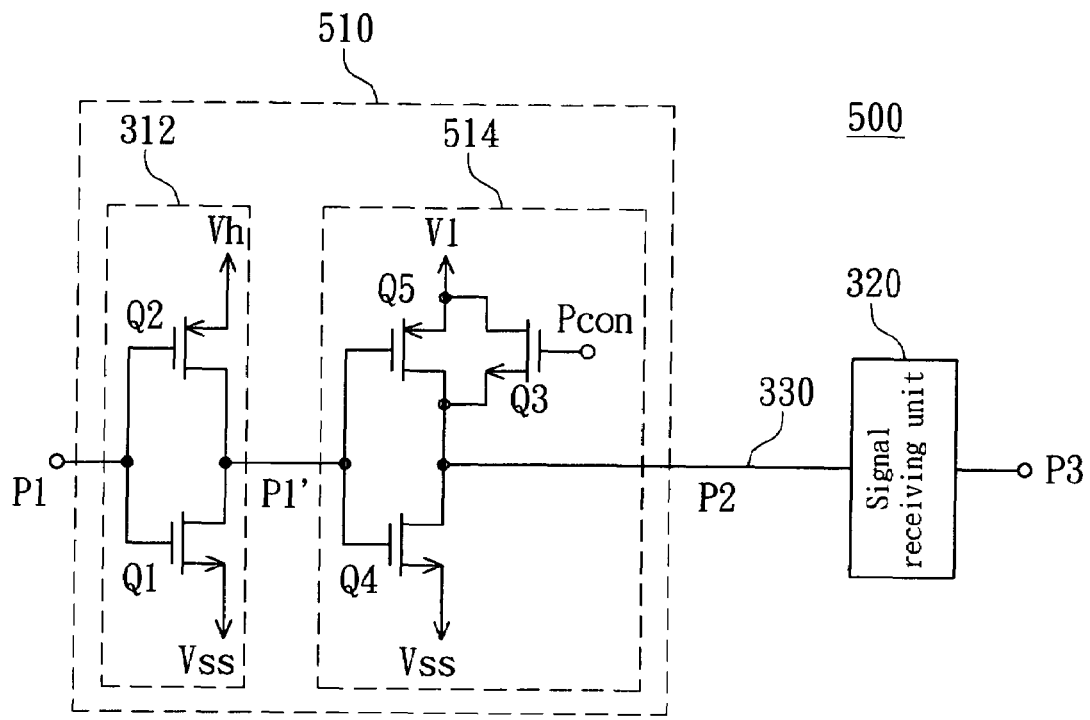
FIG. 5 is a configuration diagram of the signal transmitting system according to third embodiment of the invention.

Referring to FIG. 5, a configuration diagram of the signal transmitting system according to third embodiment of the invention is shown. What the present preferred embodiment differs with first embodiment is: the signal driving device 514 has one more PMOS transistor Q5 than the signal driving device 314. The source of the PMOS transistor Q5 and the drain of the NMOS transistor Q3 are electrically coupled, the gate of the PMOS transistor Q5 and the gate of the NMOS transistor Q4 are electrically coupled, while the drain of the PMOS transistor Q5 and the source of the NMOS transistor Q3 are electrically coupled with other conditions remaining unchanged. The present preferred embodiment also has the condition: the control signal high level>the second high level+Vtn.

Figure 9:
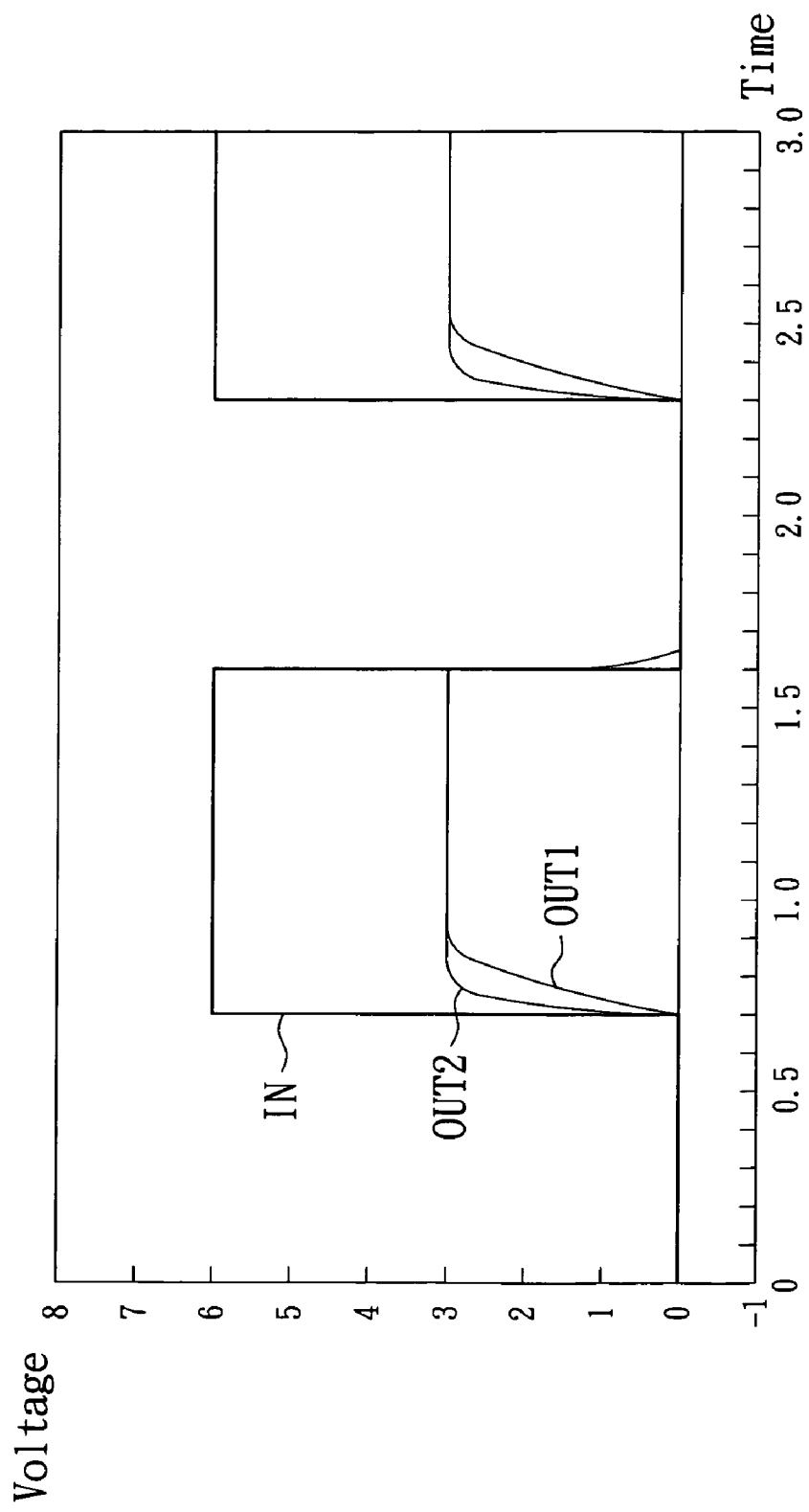
FIG. 9 is a simulation of a conventional signal transmitting system and third embodiment.

Referring to FIG. 9, a simulation of a conventional signal transmitting system and third embodiment is shown. Signal OUT1 is an outputting signal of the inverting device 114, signal OUT2 is an outputting signal of the signal driving device 514, signal IN is a signal for both the signal outputting unit 110 and the signal outputting unit 510. The transistor aspect ratio (W/L) affects the transmission speed and driving ability of the signal, the simulation disclosed below will prove the advantages of the present preferred embodiment.

The setting of W/L of MOS transistor as in the signal driving device 514 and in the inverting device 114 according to prior art is as follows: the W/L of the PMOS transistor T4 of the inverting device 114 is 1000 um/6 um; in the signal driving device 514, the W/L of the PMOS transistor Q5 is 1000 um/6 um and that of the NMOS transistor Q3 is 50 um/6 um with other conditions remaining unchanged. It can be seen from FIG. 9, the rise time of the signal OUT1 is approximately 1us and that of the signal OUT2 is 0.6 us. Comparing the area of the PMOS transistor T4 with the area of the sum of the NMOS transistor Q3 and the PMOS transistor Q5: the sum of the NMOS transistor Q3 and PMOS transistor Q5 is only 5% larger than the PMOS transistor T4, while when inputting the same signal IN, the rise time of outputted the signal OUT2 is 40% shorter than the rise time of the signal OUT1. It can be obviously seen from the above disclosure the improvement in the driving ability and the enhancement in the transmission speed.

On the other hand, to adjust the rise time of the signal OUT2 to be the same with that of the signal OUT1, i.e., 1 us, according to the experiment, the W/L of the PMOS transistor Q5 only needs to be 200 um/6 um, and the W/L of the NMOS transistor Q3 only needs to be 50 um/6 um. The sum of the area of the transistors has been reduced to be 250 um*6 um, far smaller than the area of the PMOS transistor T4, i.e., 1000 um*6 um, so as to achieve the object of saving the size of the signal transmitting system.

EMBODIMENT FOUR

Figure 6:
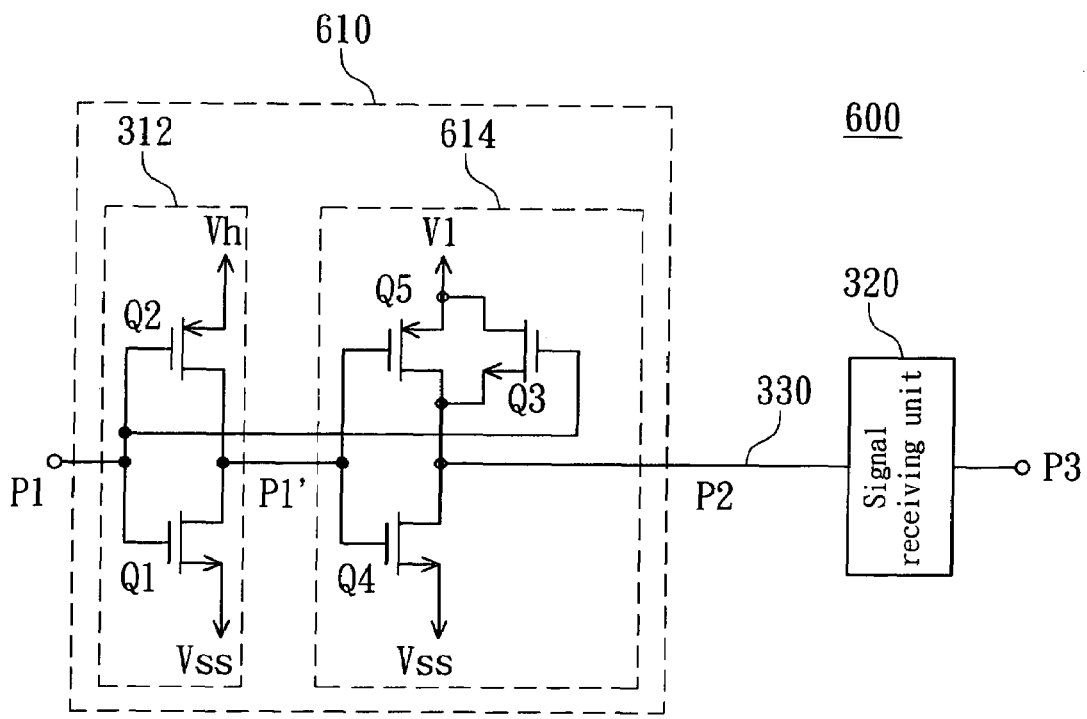
FIG. 6 is a configuration diagram of the signal transmitting system according to fourth embodiment of the invention.

Referring to FIG. 6, a configuration diagram of the signal transmitting system according to fourth embodiment of the invention is shown. What the present preferred embodiment differs with third embodiment is: in the signal driving device 514, the gate of the NMOS transistor Q3 receives the control signal Pcon, and in the signal driving device 614, the gate of the NMOS transistor Q3 receives the first signal P1 with other conditions remaining unchanged. Like second embodiment, the present preferred embodiment also needs to comply with the condition that the main voltage Vh must be higher than the sum of the main voltage VI and Vtn.

EMBODIMENT FIVE

Figure 7:
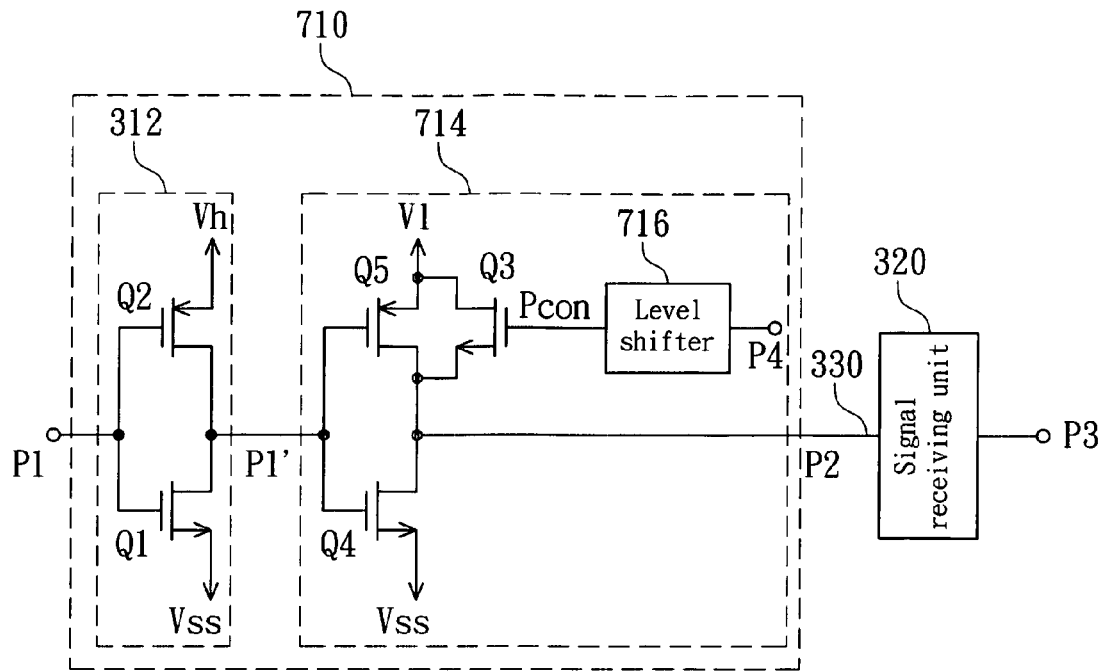
FIG. 7 is a configuration diagram of the signal transmitting system according to fifth embodiment of the invention.

Referring to FIG. 7, a configuration diagram of the signal transmitting system according to fifth embodiment of the invention is shown. What the present preferred embodiment differs with third embodiment is: the signal driving device 714 has one more level shifter 716 than the signal driving device 514 has. The level shifter 716 receives a fourth signal P4 and amplifies the level of the fourth signal P4 for outputting the control signal Pcon to the gate of the NMOS transistor Q3, wherein the fourth signal P4 and the first signal P1 are substantially of the same phase. Like third embodiment, the present preferred embodiment also needs to comply with the condition that the high level of control signal Pcon must be higher than the sum of the second high level and Vtn.

EMBODIMENT SIX

Figure 8:
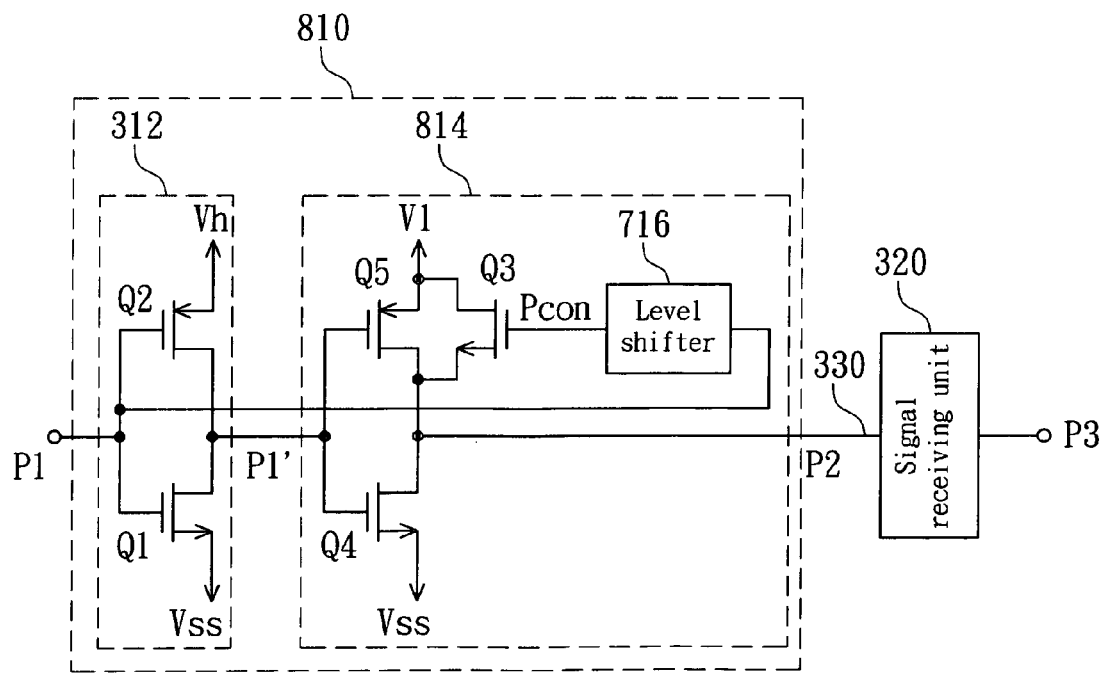
FIG. 8 is a configuration diagram of the signal transmitting system according to sixth embodiment of the invention.

Referring to FIG. 8, a configuration diagram of the signal transmitting system according to sixth embodiment of the invention is shown. What the present preferred embodiment differs with fifth embodiment is: the fourth signal P4 of the level shifter 716 receives the first signal P1. In the present preferred embodiment also has to comply with the condition that the main voltage Vh must be higher than the sum of the main voltages VI and Vtn.

Figure 10:
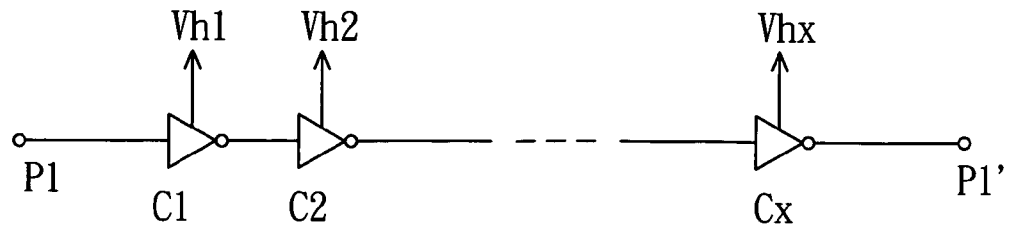
FIG. 10 is another example of an inverting device.

Referring to FIG. 10, another example of an inverting device is shown. The inverting device 912 comprises x CMOS inverters, namely CMOS inverter C1, CMOS inverter C2 to the CMOS inverter Cx, where x is an odd number. In the above preferred embodiments, the inverting device 312 can be replaced by the inverting device 912 to increase the power current driving ability of the signal outputting unit so that signal transmission speed can be increased. When the inverting device 912 is used to replace the inverting device 312, the control signal Pcon can be adapted to receive the first signal P1 or the input signal of the m-th CMOS inverter Cm of the inverting device 912, wherein m is odd-numbered and is smaller than x, with the conditions that the main voltage Vhm>the main voltage VI+Vtn, and that the main voltage Vhm is the main voltage of the CMOS inverter Cm.

Figure 11:
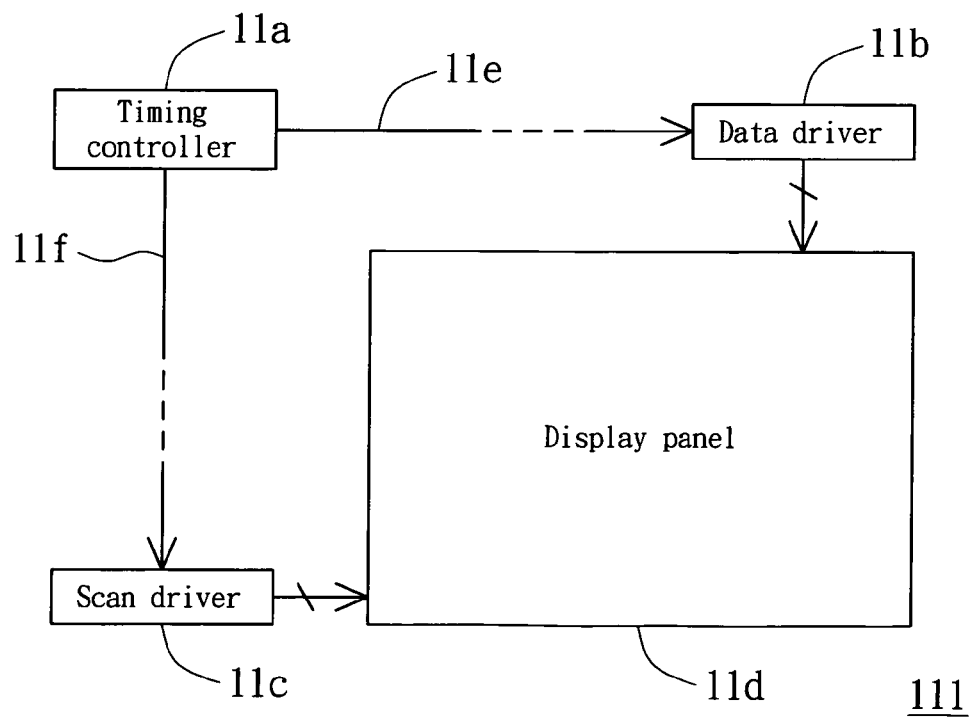
FIG. 11 is a diagram showing the status when the signal transmitting system according to the invention is applied to an LCD panel.

Referring to FIG. 11, a diagram showing the status when the signal transmitting system according to the invention is applied to an LCD panel is shown. LCD panel 111 comprises a timing controller 11a, a data driver 11b, a scan driver 11c and a display panel 11d. The timing controller 11a transmits the control signal required by the data driver 11b to the data driver 11b, so the data driver 11b drives the display panel 11d. Or, the timing controller 11a transmits the scan signal required by the scan driver 11c to the scan driver 11c, so the scan driver 11c drives the display panel 11d according to the scan signal. When the timing controller 1a outputs a signal to the data driver 11b or the scan driver 11c, a transmission line 11e and a transmission line 11f of a considerable length are required. To avoid power loss problem of the signal, the above signal transmitting system can be applied to the LCD panel. The signal outputting unit can be the timing controller 11a, while the signal receiving unit can be the data driver 11b or the scan driver 11c for instance. When the signal transmitting system of the invention is applied to the LCD panel, the NMOS transistor Q1, the NMOS transistor Q3, the NMOS transistor Q4, the PMOS transistor Q2 and the PMOS transistor Q5 can be achieved by a thin film transistor (TFT) LCD.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal driving device electrically connected with an inverting device, the inverting device receiving a first signal and outputting a first inverted signal, the signal driving device comprising:
   a first NMOS transistor, the drain of the first NMOS transistor being biased by a first voltage, the gate of the first NMOS transistor receiving a control signal, the control signal and the first signal being substantially of the same phase, the control signal being other than and differing from the first signal; and
   a second NMOS transistor, the gate of the second NMOS transistor receiving the first inverted signal, the source of the second NMOS transistor being biased by a second voltage, the second voltage being lower than the first voltage; the drain of the second NMOS transistor being electronically coupled to the source of the first NMOS transistor and outputting a second signal, the second signal and the first signal being substantially of the same phase;
   wherein a high level of the first signal is higher than a high level of the second signal.

2. The signal driving device according to claim 1, wherein the gate of the first NMOS transistor is adapted to receive the first signal.

3. The signal driving device according to claim 1, further comprising a PMOS transistor, the source of the PMOS transistor and the drain of the first NMOS transistor being electrically coupled, the gate of the PMOS transistor and the gate of the second NMOS transistor being electronically coupled, the drain of the PMOS transistor and the source of the first NMOS transistor being electronically coupled.

4. The signal driving device according to claim 3, wherein the gate of the first NMOS transistor is adapted to receive the first signal.

5. The signal driving device according to claim 3, further comprising a level shifter, the level shifter receiving a third signal and amplifying the level of the third signal for outputting the control signal to the gate of the first NMOS transistor, the third signal and the first signal being substantially of the same phase.

6. The signal driving device according to claim 5, wherein the level shifter is adapted to receive the first signal.

7. A signal driving device electrically connected with an inverting device, the inverting device receiving a first signal and outputting a first inverted signal, the signal driving device comprising:
   a first NMOS transistor, the drain of the first NMOS transistor being biased by a first voltage, the gate of the first NMOS transistor receiving a control signal, the control signal and the first signal being substantially of the same phase;
   a second NMOS transistor, the gate of the second NMOS transistor receiving the first inverted signal, the source of the second NMOS transistor being biased by a second voltage, the second voltage being lower than the first voltage, the drain of the second NMOS transistor being electronically coupled to the source of the first NMOS transistor and outputting a second signal, the second signal and the first signal being substantially of the same phase; and
   a PMOS transistor, the source of the PMOS transistor and the drain of the first NMOS transistor being electrically coupled, the gate of the PMOS transistor and the gate of the second NMOS transistor being electronically coupled, the drain of the PMOS transistor and the source of the first NMOS transistor being electronically coupled;
   wherein a high level of the first signal is higher than a high level of the second signal.

8. The signal driving device according to claim 7, wherein the gate of the first NMOS transistor is adapted to receive the first signal.

9. The signal driving device according to claim 7, further comprising a level shifter, the level shifter receiving a third signal and amplifying the level of the third signal for outputting the control signal to the gate of the first NMOS transistor, the third signal and the first signal being substantially of the same phase.

10. The signal driving device according to claim 9, wherein the level shifter is adapted to receive the first signal.

11. A signal transmitting system, comprising:
    a signal outputting unit, comprising:
       an inverting device, for receiving a first signal and outputting a first inverted signal; and
       a signal driving device, for receiving the first inverted signal and outputs a second signal, comprising:
          a first NMOS transistor, the drain of the first NMOS transistor being biased by a first voltage, the gate of the first NMOS transistor receiving a control signal, the control signal and the first signal being substantially of the same phase, the control signal being other than and differing from the first signal; and
          a second NMOS transistor, the gate of the second NMOS transistor receiving the first inverted signal, the source of the second NMOS transistor being biased by a second voltage, the second voltage being lower than the first voltage, the drain of the second NMOS transistor being electronically coupled to the source of the first NMOS transistor and outputting the second signal, the second signal and the first signal being substantially of the same phase; wherein a high level of the first signal is higher than a high level of the second signal; and a signal receiving unit, for receiving the second signal and outputting a third signal accordingly, a high level of the third signal being substantially the same with the high level of the first signal.

12. The signal transmitting system according to claim 11, wherein the inverting device comprises N CMOS inverters, and N is an odd number.

13. The signal transmitting system according to claim 11, wherein the gate of the first NMOS transistor is adapted to receive the first signal.

14. The signal transmitting system according to claim 11, wherein the signal outputting unit comprises a timing controller applied to a LCD panel.

15. The signal transmitting system according to claim 14, wherein the signal receiving unit comprises a data driver applied to the LCD panel.

16. The signal transmitting system according to claim 14, wherein the signal receiving unit comprises a scan driver applied to the LCD panel.

17. The signal transmitting system according to claim 11, wherein the signal driving device further comprises a PMOS transistor, the source of the PMOS transistor and the drain of the first NMOS transistor are electrically coupled, the gate of the PMOS transistor and the gate of the second NMOS transistor are electrically coupled, and the drain of the PMOS transistor and the source of the first NMOS transistor are electrically coupled.

18. The signal transmitting system according to claim 17, wherein the signal driving device further comprises a level shifter for receiving a fourth signal and amplifying the level of the fourth signal and outputting the control signal to the gate of the first NMOS transistor, and the fourth signal and the first signal are substantially of the same phase.

19. The signal transmitting system according to claim 18, wherein the level shifter is adapted to receive the first signal.

20. A signal transmitting system comprising:

a signal outputting unit comprising:

an inverting device, for receiving a first signal and outputting a first inverted signal; and a signal driving device, for receiving the first inverted signal and outputs a second signal comprising:

a first NMOS transistor, the drain of the first NMOS transistor being biased by a first voltage, the gate of the first NMOS transistor receiving a control signal, the control signal and the first signal being substantially of the same phase;

a second NMOS transistor, the gate of the second NMOS transistor receiving the first inverted signal, the source of the second NMOS transistor being biased by a second voltage, the second voltage being lower than the first voltage, the drain of the second NMOS transistor being electronically coupled to the source of the first NMOS transistor and outputting the second signal, the second signal and the first signal being substantially of the same phase; wherein a high level of the first signal is higher than a high level of the second signal; and a PMOS transistor, the source of the PMOS transistor and the drain of the first NMOS transistor are electrically coupled, the gate of the PMOS transistor and the gate of the second NMOS transistor are electrically coupled, and the drain of the PMOS transistor and the source of the first NMOS transistor are electrically coupled; and a signal receiving unit, for receiving the second signal and outputting a third signal accordingly, a high level of the third signal being substantially the same with the high level of the first signal.

21. The signal transmitting system according to claim 20, wherein the signal driving device further comprises a level shifter for receiving a fourth signal and amplifying the level of the fourth signal and outputting the control signal to the gate of the first NMOS transistor, and the fourth signal and the first signal are substantially of the same phase.

22. The signal transmitting system according to claim 21, wherein the level shifter is adapted to receive the first signal.

23. A signal transmitting method for applying to an signal driving device, the signal driving device being electrically connected with an inverting device, the inverting device receiving a first signal and outputting a first inverted signal, the signal driving device comprising a first NMOS transistor and a second NMOS transistor, the gate of the second NMOS transistor receiving the first inverted signal, the source of the first NMOS transistor and the drain of the second NMOS transistor being electronically coupled for outputting a second signal, the drain of the first NMOS transistor being biased by a first voltage, the gate of the first NMOS transistor receiving a control signal, the control signal and the first signal being substantially of the same phase, the source of the second NMOS transistor being biased by a second voltage which is lower than the first voltage, the method comprising:

providing the control signal having a low level to the first NMOS when the first signal is at a low level, so that the second NMOS transistor is conducted and the first NMOS transistor is cut-off, the control signal being other than and differing from the first signal; and providing the control signal having a high level to the first NMOS when the first signal is at a high level, wherein the high level of the control signal is higher than the sum of a high level of the second signal and the threshold voltage of the first NMOS transistor, so that the second NMOS transistor is cut-off, the first NMOS transistor is conducted, and the first NMOS transistor outputs the second signal having substantially the same phase with the first signal;

wherein the high level of the first signal is higher than the high level of the second signal.

24. The signal transmitting method according to claim 23, further comprising adapting the gate of the first NMOS transistor to receive the first signal.

25. The signal transmitting method according to claim 23, further comprising:

transmitting the first inverted signal to the gate of a PMOS transistor; and outputting the second signal from the drain of the PMOS transistor.

26. The signal transmitting method according to claim 25, further comprising receiving a third signal to a level shifter and enlarging the level of the third signal for outputting the control signal to the gate of the first NMOS transistor.

27. The signal transmitting method according to claim 26, further comprising adapting the level shifter to receive the first signal.

28. A signal transmitting method for applying to an signal driving device, the signal driving device being electrically connected with an inverting device, the inverting device receiving a first signal and outputting a first inverted signal, the signal driving device comprising a first NMOS transistor and a second NMOS transistor, the gate of the second NMOS transistor receiving the first inverted signal, the source of the first NMOS transistor and the drain of the second NMOS transistor being electronically coupled for outputting a second signal, the drain of the first NMOS transistor being biased by a first voltage, the gate of the first NMOS transistor receiving a control signal, the control signal and the first signal being substantially of the same phase, the source of the second NMOS transistor being biased by a second voltage which is lower than the first voltage, the method comprising:

providing the control signal having a low level to the first NMOS when the first signal is at a low level, so that the second NMOS transistor is conducted and the first NMOS transistor is cut-off;

providing the control signal having a high level to the first NMOS when the first signal is at a high level, wherein the high level of the control signal is higher than the sum of a high level of the second signal and the threshold voltage of the first NMOS transistor, so that the second NMOS transistor is cut-off, the first NMOS transistor is conducted, and the first NMOS transistor outputs the second signal having substantially the same phase with the first signal;

transmitting the first inverted signal to the gate of a PMOS transistor; and outputting the second signal from the drain of the PMOS transistor, wherein the high level of the first signal is higher than the high level of the second signal.

29. The signal transmitting method according to claim 28, further comprising receiving a third signal to a level shifter and enlarging the level of the third signal for outputting the control signal to the gate of the first NMOS transistor.

30. The signal transmitting method according to claim 29, further comprising adapting the level shifter to receive the first signal.

\* \* \* \* \*